United States Patent
Nathawad

(10) Patent No.: US 8,187,944 B2
(45) Date of Patent: May 29, 2012

(54) PATTERNED CAPACITOR GROUND SHIELD FOR INDUCTOR IN AN INTEGRATED CIRCUIT

(75) Inventor: Lalitkumar Nathawad, Costa Mesa, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 0 days.

(21) Appl. No.: 13/340,622

(22) Filed: Dec. 29, 2011

(65) Prior Publication Data
US 2012/0098621 A1    Apr. 26, 2012

Related U.S. Application Data

(62) Division of application No. 12/243,146, filed on Oct. 1, 2008, now Pat. No. 8,106,479.

(51) Int. Cl.
*H01L 27/00* (2006.01)
*H01L 21/20* (2006.01)

(52) U.S. Cl. .................................................. 438/381

(58) Field of Classification Search .......... 257/213–413, 257/900, 902–903, 532, 533, 535, 536, E51.003, 257/E51.025, E27.016, E27.017, E27.019, 257/E27.02, E27.021, E27.023, E27.033, 257/E27.037, E27.038, E27.042, 659, 531, 257/665; 438/957, 381, 171, 190, 210, 238, 438/239, 329

See application file for complete search history.

(56) References Cited

U.S. PATENT DOCUMENTS

| | | | |
|---|---|---|---|
| 5,831,331 A * | 11/1998 | Lee | 257/659 |
| 6,628,158 B2 * | 9/2003 | Forbes | 327/292 |
| 8,041,059 B2 * | 10/2011 | Miyazaki | 381/191 |
| 2004/0004255 A1 * | 1/2004 | Yoshimura | 257/379 |
| 2005/0012153 A1 * | 1/2005 | Ipposhi | 257/347 |
| 2005/0077592 A1 | 4/2005 | Hsieh | |
| 2006/0157798 A1 | 7/2006 | Hayashi et al. | |
| 2006/0292851 A1 * | 12/2006 | Lin et al. | 438/618 |
| 2007/0262418 A1 * | 11/2007 | Degani et al. | 257/538 |

* cited by examiner

*Primary Examiner* — Dao H Nguyen
*Assistant Examiner* — Tram H Nguyen
(74) *Attorney, Agent, or Firm* — Bever, Hoffman & Harms, LLP

(57) ABSTRACT

Integrated circuits are disclosed including at least one inductor-capacitor component, where each of the inductor-capacitor components includes an inductor and a capacitor constructed between the inductor and a substrate. The inductor includes at least one metal loop over a shield pattern forming a first capacitor terminal over patterned oxide layer with a second capacitor layer between the patterned oxide layer and the substrate.

6 Claims, 4 Drawing Sheets

PATTERNED CAPACITOR GROUND SHIELD FOR INDUCTOR IN AN INTEGRATED CIRCUIT

RELATED APPLICATIONS

This application is a divisional of U.S. patent application Ser. No. 12/243,146, entitled "Patterned Capacitor Ground Shield For Inductor In An Integrated Circuit" filed Oct. 1, 2008.

TECHNICAL FIELD

This invention relates to capacitors located between inductors and substrates in integrated circuits.

BACKGROUND OF THE INVENTION

FIGS. 1A to 1C show a prior art configuration of an inductor found in some integrated circuits with a single loop of metal above a shield layer formed in polysilicon usually tied to ground, with the shield layer electrically often isolated by a thick layer of oxide from a substrate. In many processes, this oxide layer is a field oxide, but may be comprised of other dielectric material. While this configuration works, a capacitor, such as is often needed in various circuits, may necessarily take up more die area, and thus incur additional manufacturing costs. What is needed is an area efficient structure that supports both an inductor and a capacitor.

SUMMARY OF THE INVENTION

Embodiments of this invention include integrated circuits including at least one inductor-capacitor component, where each of the inductor-capacitor components includes an inductor and a capacitor constructed between the inductor and a substrate. The inductor may include at least one metal loop over a shield pattern forming a first capacitor terminal over a patterned oxide layer with a second capacitor layer between the boundary of the patterned shield and the substrate. As used herein, oxide layers will refer to some form of silicon dioxide, commonly known as glass. The metal loop includes a first and second inductor terminal. The second capacitor layer is used for the second capacitor terminal. The metal loop may be formed of one or multiple metal layers interconnected by vias and often separated by one or more layers of intermetal dielectrics from each other and from the shield.

The integrated circuit may preferably include an RC filter using the capacitor coupled to a resistor, in particular when the semiconductor manufacturing process generates capacitors with low quality (Q) ratings. Alternatively, the integrated circuit may include at least one of its inductor-capacitor components coupled as a parallel LC circuit or coupled as a series LC circuit. These configurations may be further used in any of a variety of circuits including, but not limited to, a high pass filter, a low pass filter, a band pass filter, a voltage controlled oscillator, a phase locked loop and/or a frequency synthesizer, any of which may be located in a high frequency component of a radio frequency and/or optical frequency interface, such as a transceiver, its transmitter or receiver.

The inductor-capacitor component of the integrated circuit may preferably be manufactured with a Complementary MOSfet (CMOS) semiconductor process. Alternatively, the integrated circuit may be manufactured with another semiconductor process, such as a gallium arsenide semiconductor process. In either case, manufacturing includes the following steps as reflected in the mask sets: deposition and removal step of an oxide followed by a shielding material to form the shield pattern over the patterned oxide layer, a masking/processing to create the second capacitor layer on a substrate, and a metal deposition and removal step to form the metal loop over the shield pattern to create the inductor-capacitor component in the integrated circuit.

DETAILED DESCRIPTION

This invention relates to capacitors located between inductors and substrates in integrated circuits. Embodiments of this invention include integrated circuits including at least one Inductor-capacitor component, where each of the inductor-capacitor components includes an inductor and a capacitor constructed between the inductor and a substrate. The inductor includes a metal loop over a shield pattern layer, wherein the shield pattern layer may form a first capacitor terminal over a patterned oxide layer with a second capacitor layer disposed between the boundary of the patterned shield and the substrate. The metal loop includes a first and second inductor terminal. The second capacitor layer is used for the second capacitor terminal.

Figure 2A:
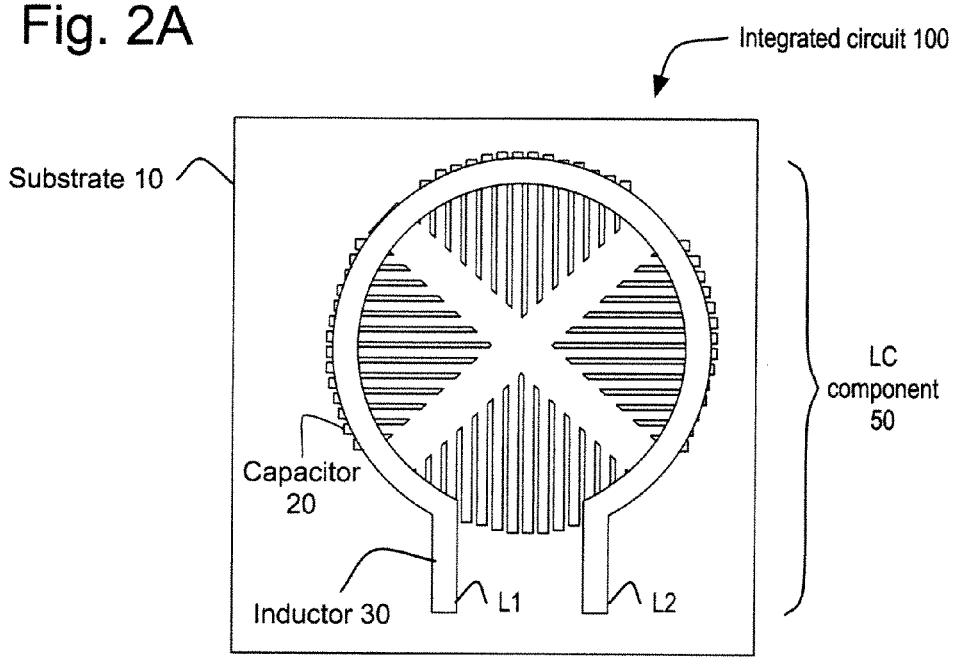
FIG. 2A shows a top view of an embodiment of an integrated circuit including an inductor-capacitor component with an inductor including a metal loop over a shield pattern of a capacitor.

Referring to the drawings more particularly by reference numbers, FIG. 2A shows a top view of an embodiment of an integrated circuit 100 including at least one inductor-capacitor component 50 including an inductor 30 including a metal loop over a shield pattern layer of a capacitor 20. The inductor includes a first inductor terminal L1 and a second inductor terminal L2.

Figure 2B:
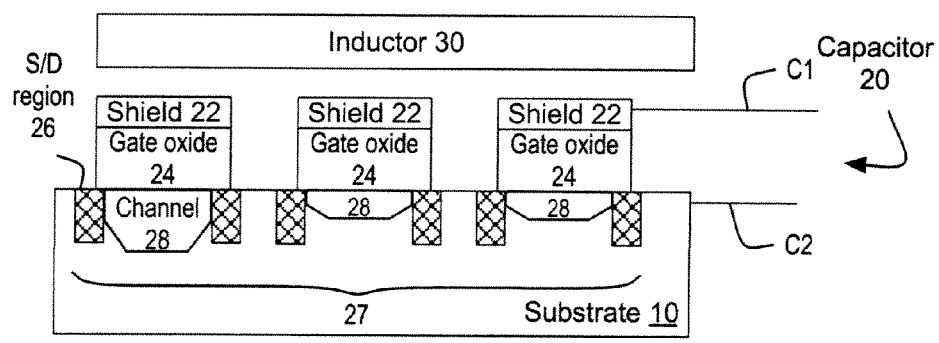
FIG. 2B shows a side cross section of the inductor-capacitor component with the inductor over the shield pattern forming a first capacitor terminal over a patterned oxide layer with a second capacitor layer between the boundary of the patterned shield and the substrate.

FIG. 2B shows a cross section of the inductor-capacitor component with the inductor 30 over the shield pattern layer 22 forming a first capacitor terminal C1 over a patterned oxide layer 24 with a second capacitor layer 27 between the substrate and the boundary of the shield pattern layer 22 and/or the patterned oxide layer 24. The second capacitor layer 27 is used to form the second capacitor terminal C2. In a Complementary MOSfet (CMOS) integrated circuit 100, the second capacitor layer 27 may be comprised of source and drain regions 26 disposed between channels 28, which with the shield pattern layer 22 disposed over the patterned oxide layer 24, form the capacitor 20. Note that the shape of the channel 28 as shown has been simplified to a schematic form and is not meant to limit the scope of the claims. The channel layer 28 is frequently very thin and has been shown here in a schematic fashion. Typically, the channel layer is very near the surface of the substrate. The patterned oxide layer 24 is preferably formed of a layer of gate oxide in certain preferred CMOS manufacturing processes, although another dielectric material such as a different oxide layer may be used. The gate oxide is often a thin dielectric layer that may provide higher capacitance for the capacitor. The metal loop may be formed of one or multiple metal layers interconnected by vias and often separated by one or more layers of inter-metal dielectrics from each other and from the shield pattern layer 22. The inductor 30 may preferably include at least the top three of five layers of metal.

The second capacitor layer 27 may be formed in a CMOS semiconductor process through a combination of deposition and etching to create the shield pattern layer 22 and the patterned oxide layer 24, followed by deposition of one or more doping materials on the substrate, which may then be further etched after a photolithographic layer has been deposited, developed and then removed often by etching. The shield pattern layer 22 may be formed of polysilicon and may be separated by one or more layers of oxide from the inductor 30. The patterned oxide layer 24 may further be a specific thin oxide layer and in some semiconductor processes this oxide layer may be referred to as a gate oxide layer.

Figure 1A:
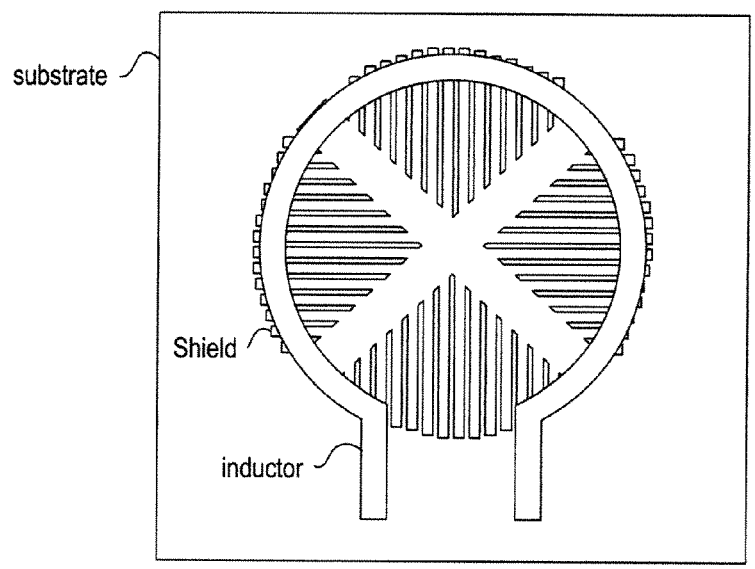
FIGS. 1A to 1C shows an example of a prior art inductor as found in a CMOS integrated circuit.
Figure 1B:
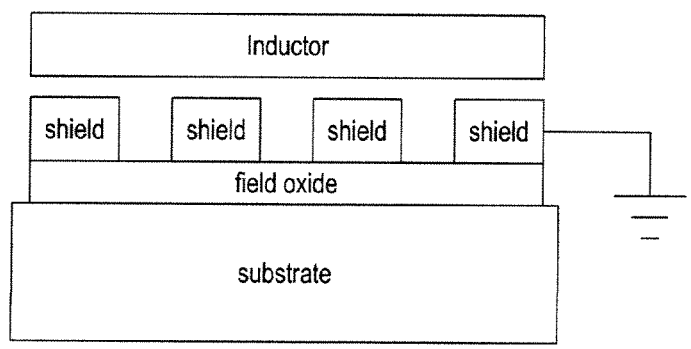
Figure 1C:
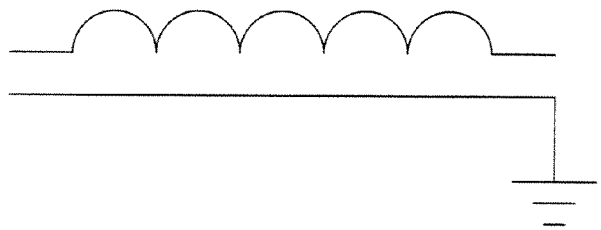
Figure 2C:
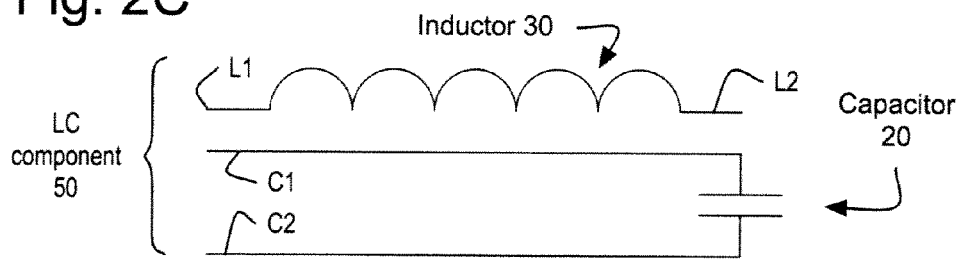
FIG. 2C shows a simplified schematic of the inductor-capacitor component with the inductor including a first and second inductor terminal and the capacitor including a first and second capacitor terminal.

FIG. 2C shows a simplified schematic of the inductor-capacitor component 50 with the inductor 30 including the first inductor terminal L1 and the second inductor terminal L2 and the capacitor 20 including the first capacitor terminal C1 and the second capacitor terminal C2. Note that contrary to the prior art inductor of FIGS. 1B and 1C, the shield pattern layer 22 shown here is not grounded but is instead part of the capacitor 20.

Figure 2D:
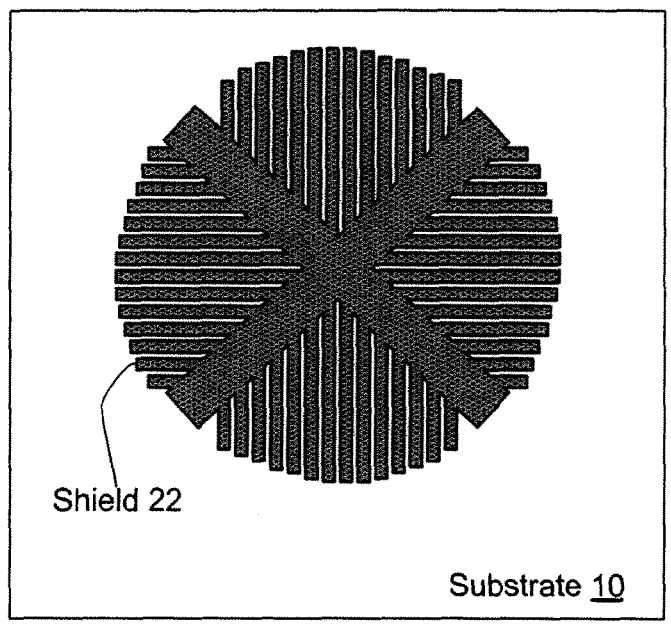
FIG. 2D shows a top view of the shield layer of FIGS. 2A and 2B with the inductor and its metal loop removed.
Figure 2E:
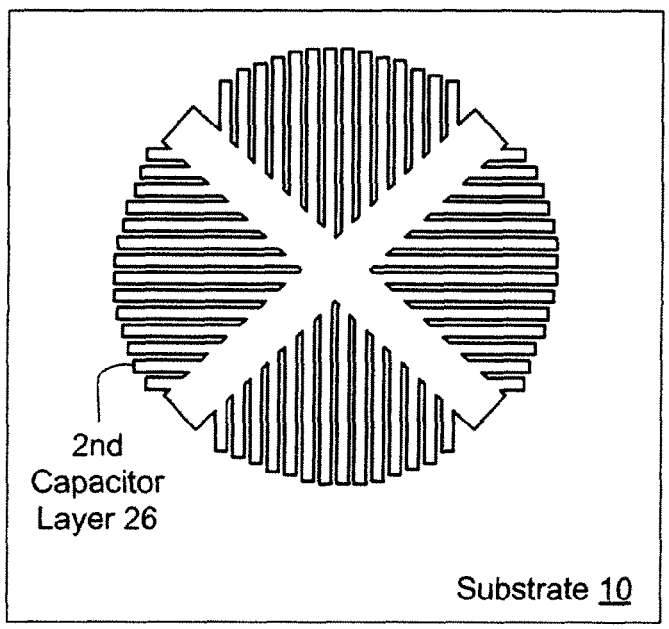
FIG. 2E shows a top view of the capacitor second layer of FIGS. 2A and 2B with the inductor and the shield removed. The capacitor second layer is made up of the source drain regions and the channel that is formed under the oxide when the MOS capacitor is biased on, that is when Vgs>Vth for the nMOS. This situation may be referred to as when the voltage between gate and source (Vgs) exceeds a threshold voltage (Vth).

FIGS. 2D and 2E show some further details of the shield pattern layer 22 and second capacitor layer 27. FIG. 2D shows a top view of the shield pattern layer 22 of FIGS. 2A and 2B with the inductor 30 and the associated metal loop omitted for clarity. FIG. 2E shows a top view of the capacitor second layer 27 of FIGS. 2A and 2B with the inductor 30 and the shield pattern layer 22 omitted for clarity. As described above, the capacitor second layer 27 may include the source and drain regions 26 and the channel 28 that is formed under the patterned oxide layer 24 when the MOS capacitor is biased on, that is when Vgs~>Vth for NMOS transistors, for example. This notation refers to the voltage between the gate and source (Vgs) exceeding a threshold voltage (Vth). It may be further preferred that the source and drain regions 26 of the second capacitor layer 27 are not shared, which may sometimes minimize and/or prevent eddy currents in the inductor-capacitor component 50 when operated. All the source and drain regions 26 may be connected along the diagonals shown in FIGS. 2A, 2D and 2E and may not be connected along the length of the fingers. Preferably the source and drain diffusions may be connected with a first metal layer (frequently closest to the substrate). Also preferred, the diagonals may be connected with the first metal layer to lower resistance within the capacitor. The shield pattern layer 22 may act as the gate between the source and drain regions 26. The source and drain regions may be formed by diffusion.

Figure 3A:
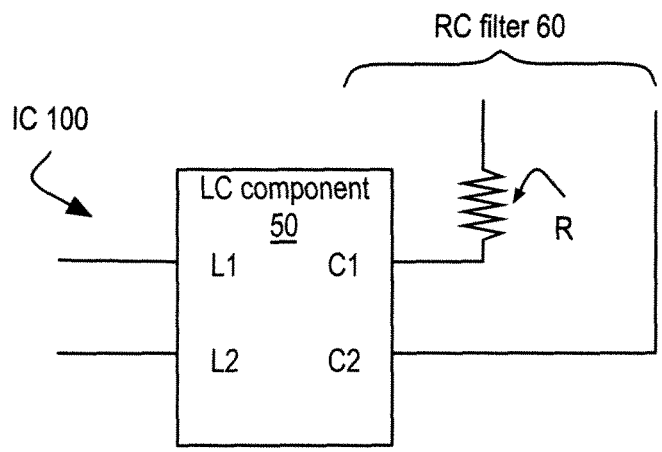
FIG. 3A shows the integrated circuit further comprising an RC filter including a resistor electrically coupled to the capacitor.
Figure 3B:
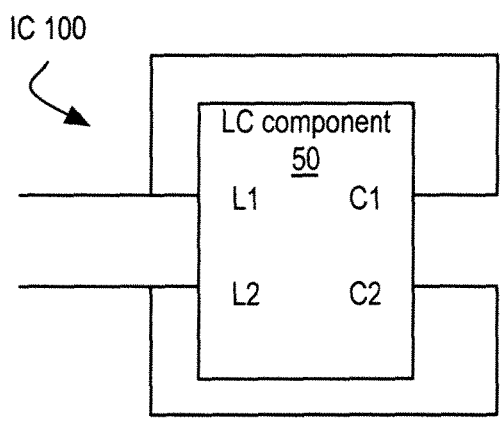
FIG. 3B shows the integrated circuit configured to use the inductor-capacitor component as a parallel LC circuit.
Figure 3C:
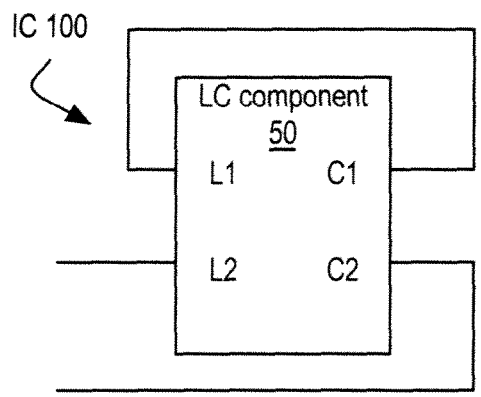
FIG. 3C shows the integrated circuit configured to use the inductor-capacitor component as a series LC circuit.

The integrated circuit 100 may preferably include an RC filter 60 using the capacitor coupled to a resistor R as shown in FIG. 3A, in particular when the semiconductor manufacturing process generates capacitors 20 with low quality (Q) ratings. Alternatively the integrated circuit may include at least one of its inductor-capacitor components 50 coupled as a parallel LC circuit as shown in FIG. 3B or coupled as a series LC circuit as shown in FIG. 3C. Note that while traditional electronic design teaches electrical coupling of the terminals L1, L2, C1 and C2 through metal conductors, in various embodiments, integrated circuits 100 may or may not use metal for these electrical couplings. In certain embodiments, polysilicon may be used, possibly also forming a resistive path.

Various configurations of the inductor-capacitor component 50 may be further used in any of a variety of circuits including, but not limited to, a high pass filter, a low pass filter, a band pass filter, a voltage controlled oscillator, a phase locked loop and/or a frequency synthesizer, any of which may be located in a high frequency component of a radio and/or optical frequency interface, such as a transceiver, its transmitter or receiver.

The inductor-capacitor component 50 in the integrated circuit 100 may be manufactured with a CMOS semiconductor process. Alternatively, the inductor-capacitor component may be manufactured with another semiconductor process such as a gallium arsenide semiconductor process. In any of these cases, manufacturing may include the following steps as reflected in the mask sets: deposition and removal step of an oxide followed by a shielding material to form the shield pattern layer 22 over the patterned oxide layer 24 as shown in FIGS. 2B and 2D, a deposition/etching to create the second capacitor layer 27 on a substrate 10 as shown in FIG. 2E, and a metal deposition and removal step to form the metal loop 30 over the shield pattern to create the inductor-capacitor component 50 in the integrated circuit. The order of these processing steps may vary.

As previously stated, for the preferred CMOS semiconductor processes, the shielding material when deposited forms a layer of polysilicon that is used to create the shield pattern layer 22 of the capacitor 20, which forms the gate of the transistor. The transistor may be used to form one or more components of the capacitor 20. In other embodiments of the manufacturing process, the shielding material may be essentially identical to the substrate 10.

The patterned oxide layer 24 may preferably be formed of a thin oxide layer, one that is not the thickest oxide layer. The thin oxide layer may be the thinnest oxide layer in some semiconductor processes.

The preceding embodiments provide examples of the invention, and are not meant to constrain the scope of the following claims.

What is claimed is:
1. A method of manufacturing an integrated circuit, comprising the step of:
  forming an inductor-capacitor component with an inductor as at least one metal loop over a capacitor on top of a substrate to create said integrated circuit;
  wherein the step forming said inductor-capacitor component further comprises the steps of:
    depositing/etching to create a shield pattern layer of said capacitor with a patterned oxide layer between a substrate and said pattern layer;

depositing/etching to create a second capacitor layer of said capacitor in said substrate and near a boundary of at least one member of the group consisting of said shield pattern layer and said patterned oxide layer; and depositing/etching on top of said shield pattern layer to create said metal loop for an inductor.

2. The method of claim 1, wherein said shield pattern layer is composed of polysilicon.

3. The method of claim 1, wherein said patterned oxide layer is composed of silicon dioxide.

4. The method of claim 1, wherein the step forming said inductor-capacitor circuit uses a CMOS semiconductor process.

5. The method of claim 1, wherein the step forming said inductor-capacitor circuit uses a gallium arsenide semiconductor process.

6. The integrated circuit as a product of the process of claim 1.

* * * * *